(12) United States Patent
Nozawa et al.

(10) Patent No.: US 12,297,539 B2
(45) Date of Patent: May 13, 2025

(54) FILM FORMING SYSTEM AND FILM FORMING METHOD

(71) Applicant: Tokyo Electron Limited, Tokyo (JP)

(72) Inventors: Syuji Nozawa, Nirasaki (JP); Tatsuya Yamaguchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/821,844

(22) Filed: Aug. 24, 2022

(65) Prior Publication Data
US 2023/0070274 A1    Mar. 9, 2023

(30) Foreign Application Priority Data
Sep. 3, 2021 (JP) .................. 2021-143971

(51) Int. Cl.
| | | |
|---|---|---|
| *C23C 16/52* | (2006.01) | |
| *B05D 1/00* | (2006.01) | |
| *C23C 16/44* | (2006.01) | |
| *C23C 16/455* | (2006.01) | |
| *C23C 16/458* | (2006.01) | |
| *C23C 16/48* | (2006.01) | |

(52) U.S. Cl.
CPC .............. *C23C 16/52* (2013.01); *B05D 1/60* (2013.01); *C23C 16/4401* (2013.01); *C23C 16/45565* (2013.01); *C23C 16/458* (2013.01); *C23C 16/48* (2013.01)

(58) Field of Classification Search
CPC ............... C23C 16/52; C23C 16/4401; C23C 16/45565; C23C 16/458; C23C 16/48; C23C 16/4586; C23C 16/44; B05D 1/60; G01B 11/0625

USPC ........ 118/663, 688, 713; 156/345.24, 345.25
See application file for complete search history.

(56) References Cited

U.S. PATENT DOCUMENTS

| | | | | |
|---|---|---|---|---|
| 5,565,114 A | * | 10/1996 | Saito ................. | H01J 37/32963 216/60 |
| 6,556,303 B1 | * | 4/2003 | Rangarajan ........ | G01B 11/0625 257/E21.53 |
| 2015/0024521 A1 | * | 1/2015 | Fukuchi ................. | H01L 22/12 156/345.24 |

(Continued)

FOREIGN PATENT DOCUMENTS

| | | |
|---|---|---|
| JP | 2003-042722 A | 2/2003 |
| JP | 2010-093039 A | 4/2010 |

*Primary Examiner* — Rudy Zervigon
(74) *Attorney, Agent, or Firm* — Armstrong Teasdale LLP

(57) ABSTRACT

A film forming system includes: a film forming apparatus which includes a processing container, a stage provided in the processing container, a structure provided in the processing container and having recesses, and a window provided on a wall surface of the processing container; a measurement device which includes a light emitter, a light receiver, and a measurer configured to measure a light reflectance for each wavelength in the structure based on an intensity of light emitted to the structure and an intensity of light reflected from the structure; and a control device which includes an estimator configured to estimate a thickness of a film formed on a substrate based on the light reflectance for each wavelength in the structure, and a controller configured to stop film formation on the substrate when the estimated thickness of the film reaches a predetermined thickness.

15 Claims, 8 Drawing Sheets

(56) References Cited

U.S. PATENT DOCUMENTS

2018/0025917 A1* 1/2018 Yatsuda ............ H01L 21/31116
                                                    438/694
2018/0057935 A1* 3/2018 Budiarto ................ C23C 16/52

* cited by examiner

| Film thickness | Reflectance distribution for each wavelength |
|---|---|
| 1nm | Distribution data 1 |
| 2nm | Distribution data 2 |
| 3nm | Distribution data 3 |
| ⋮ | ⋮ |
| 100nm | Distribution data 100 |

FILM FORMING SYSTEM AND FILM FORMING METHOD

CROSS-REFERENCE TO RELATED APPLICATION

This application is based upon and claims the benefit of priority from Japanese Patent Application No. 2021-143971, filed on Sep. 3, 2021, the entire contents of which are incorporated herein by reference.

TECHNICAL FIELD

Various aspects and embodiments of the present disclosure relate to a film forming system and a film forming method.

BACKGROUND

For example, Patent Document 1 discloses a plasma processing apparatus for performing an etching process, in which a monitoring window made of a transparent material such as quartz glass is provided on a ceiling of a processing chamber. In this plasma processing apparatus, light is emitted from the window into the processing chamber during a deposition process before the etching process, and an end timing of the deposition process is determined based on a change in intensity of light reflected from deposits adhered to an inner side of the window. Thus, it is possible to deposit the deposits having an appropriate thickness in an opening of a resist pattern so that a dimension of a convex portion of the resist pattern can be adjusted with high accuracy.

In addition, Patent Document 2 discloses a technique of emitting visible light to a surface of a substrate and measuring a film thickness by using a reflection spectrum signal of reflected light detected by a light-collecting probe.

PRIOR ART DOCUMENTS

Patent Documents

Patent Document 1: Japanese Patent Laid-Open Publication No. 2010-93039
Patent Document 2: Japanese Patent Laid-Open Publication No. 2003-42722

SUMMARY

An aspect of the present disclosure is a film forming system that includes a film forming apparatus configured to form a film on a substrate, a measurement device configured to measure a light reflectance for each wavelength in a film formed at a predetermined position in the film forming apparatus, and a control device configured to control the film forming apparatus and the measurement device. The film forming apparatus includes a processing container, a stage, a structure, and a window. The stage is provided in the processing container, and a substrate is placed thereon. The structure is provided in the processing container and has recesses. The window is provided on the wall surface of the processing container and is formed by a light-transmitting member. The measurement device has a light emitter, a light receiver, and a measurer. The light emitter emits light having a plurality of wavelengths to the structure via the window. The light receiver receives, via the window, light of each wavelength reflected from the structure. The measurer measures a light reflectance for each wavelength in the structure based on an intensity of the light emitted to the structure and an intensity of the light reflected from the structure. The control device includes an estimator and a controller. The estimator estimates a thickness of the film formed on the substrate based on the light reflectance for each wavelength in the structure. The controller stops film formation on the substrate when the estimated film thickness reaches a predetermined thickness.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is a view illustrating an example of waveform data stored in a database (DB).

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a film forming system and a film forming method disclosed herein will be described in detail with reference to the drawings. The disclosed film forming system and film forming method are not limited by the following embodiments.

A thickness of a film formed on a substrate may fluctuate due to influences of a pressure in a film forming apparatus, a temperature of the substrate, and the like. In addition, with miniaturization of semiconductor devices in recent years, the thickness of the film formed on the substrate tends to be reduce. As the thickness of the film formed on the substrate decreases, a slight change in a status in the film forming apparatus causes a significant fluctuation of the film thickness. Therefore, it is difficult to control the thickness of the film formed on the substrate with high accuracy.

When the thickness of the film formed on the substrate can be measured in real time, it is possible to control the thickness of the film formed on the substrate even if the status in the film forming apparatus changes. However, in the techniques of the above-mentioned patent documents, when the film thickness decreases, measurement accuracy of the film thickness decreases. Therefore, it is difficult to measure the thickness of the thin film formed on the substrate with high accuracy.

Therefore, the present disclosure provides a technique capable of controlling a thickness of a film formed on a substrate with high accuracy.

[Configuration of Film Forming System 10]

Figure 1:
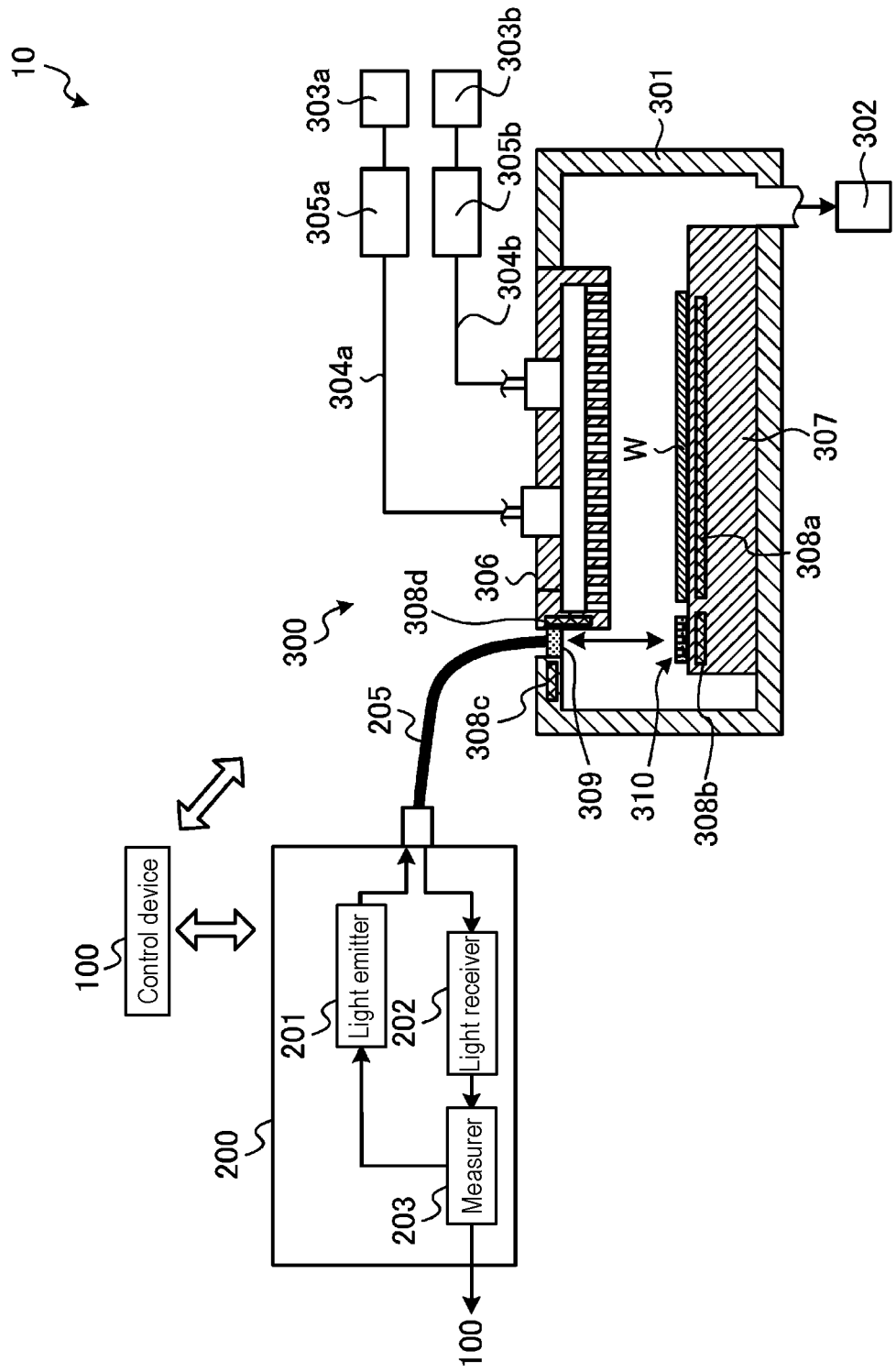
FIG. 1 is a schematic view illustrating an example of a film forming system according to an embodiment.

FIG. 1 is a schematic view illustrating an example of a film forming system 10 according to an embodiment. The film forming system 10 includes a control device 100, a measurement device 200, and a film forming apparatus 300. The film forming apparatus 300 forms a film on a substrate W. The measurement device 200 measures a light reflectance for each wavelength in the film formed at a predetermined position in the film forming apparatus 300. The control device 100 controls the measurement device 200 and the film forming apparatus 300.

The film forming apparatus 300 includes a processing container 301, an exhaust device 302, a shower head 306, and a stage 307. In the present embodiment, the film forming apparatus 300 is, for example, a chemical vapor deposition (CVD) apparatus. The shower head 306 is provided in an upper portion of the processing container 301. Two types of raw-material monomers are supplied to the processing container 301 via the shower head 306. The two types of raw-material monomers are, for example, isocyanate and amine. A raw-material source 303a configured to accommodate isocyanate as liquid is connected to the shower head 306 via a pipe 304a. In addition, a raw-material source 303b configured to accommodate amine as liquid is connected to the shower head 306 via a pipe 304b.

The liquid isocyanate supplied from the raw-material source 303a is vaporized by a vaporizer 305a interposed in the pipe 304a. The isocyanate vapor vaporized by the vaporizer 305a is introduced into the shower head 306 via the pipe 304a. In addition, the liquid amine supplied from the raw-material source 303b is vaporized by a vaporizer 305b interposed in the pipe 304b. The amine vapor vaporized by the vaporizer 305b is introduced into the shower head 306.

A plurality of ejection holes is formed on a lower surface of the shower head 306. The shower head 306 ejects the isocyanate vapor introduced via the pipe 304a and the amine vapor introduced via the pipe 304b into the processing container 301 from separate ejection holes, respectively, in a shower shape. The shower head 306 is an example of a gas supply.

The exhaust device 302 exhausts a gas in the processing container 301. An interior of the processing container 301 is controlled to a predetermined pressure by the exhaust device 302. The exhaust device 302 is controlled by the control device 100.

The stage 307 on which the substrate W is placed is provided in the processing container 301. The stage 307 is provided with a heater 308a for adjusting a temperature of the substrate W. By controlling the heater 308a, the control device 100 controls the temperature of the substrate W such that a top surface of the substrate W has a temperature appropriate for vapor deposition polymerization of the raw-material monomers. The temperature appropriate for the vapor deposition polymerization of the raw material monomers may be determined depending on the types of the raw-material monomers, and may be set to, for example, 40 degrees C. to 200 degrees C.

By using the film forming apparatus 300 described above, an organic material is laminated on the surface of the substrate W by causing a vapor deposition polymerization reaction of two types of raw-material monomers on the surface of the substrate W. When the two types of raw-material monomers are isocyanate and amine, a polymer film having urea bonds is formed on the surface of the substrate W.

In addition, a monitor part 310 having recesses is provided in the processing container 301. The monitor part 310 is an example of a structure having recesses. In the present embodiment, the monitor part 310 is disposed on a top surface of the stage 307 and outside a region where the substrate W is disposed such that the recesses in the monitor part 310 face upward.

Figure 2:
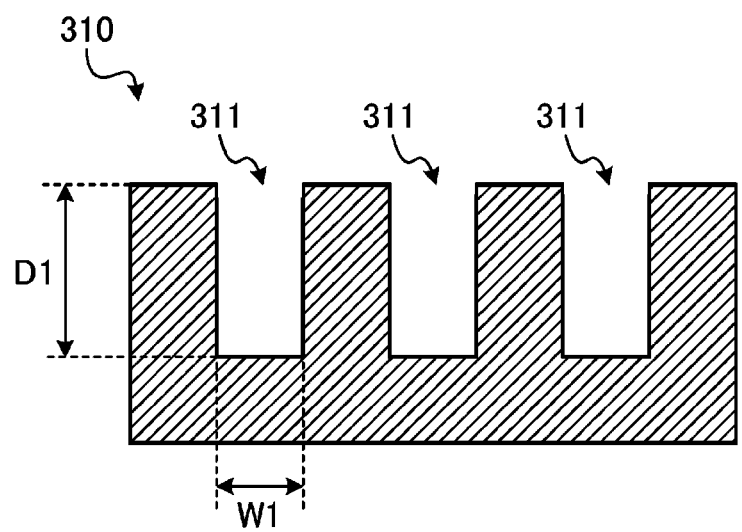
FIG. 2 is a cross-sectional view illustrating an example of a monitor part.

FIG. 2 is a cross-sectional view illustrating an example of the monitor part 310. A plurality of recesses 311 is formed in the monitor part 310. For each of the recesses 311, a depth D1 is, for example, 20 nm or more, and an opening width W1 is set depending on a film thickness of the polymer film formed on the substrate W. The opening width W1 is, for example, a width of twice or less the film thickness of the polymer film formed on the substrate W. When the film thickness of the polymer film formed on the substrate W is, for example, 10 nm, the opening width W1 is set to be, for example, 20 nm or less. When the film thickness of the polymer film formed on the substrate W is, for example, 5 nm, the opening width W1 is set to be, for example, 10 nm or less. In the present embodiment, a polymer film having a thickness of 10 nm is formed on the substrate W, the depth D1 of each recess 311 is, for example, 20 nm, and the opening width W1 of each recess 311 is, for example, 20 nm.

Below the monitor part 310 in the processing container 301, a heater 308b for heating the monitor part 310 is provided. The control device 100 controls a temperature of the monitor part 310 by controlling the heater 308b. For example, the control device 100 controls the heater 308b such that the monitor part 310 and the substrate W have the same temperature during a film forming process. In addition, when cleaning the interior of the processing container 301, the control device 100 controls the heater 308b such that the temperature of the monitor part 310 becomes higher than the temperature thereof during the film forming process. The temperature higher than the temperature in the film forming process is, for example, a temperature of 300 degrees C. or higher. Thus, it is possible to efficiently remove the film formed in the recesses 311 of the monitor part 310.

A window 309 is provided above the monitor part 310 and in a wall surface at a position facing the monitor part 310. The window 309 is formed by a member that transmits light, such as quartz. Heaters 308c and 308d for heating the window 309 are provided around the window 309. The control device 100 controls a temperature of the window 309 by controlling the heater 308c and the heater 308d. The measurement device 200 is connected to the window 309 via an optical fiber 205.

For example, the control device 100 controls the heater 308c and the heater 308d such that the window 309 has a temperature at which reaction by-products (so-called deposits) are unlikely to adhere to the window 309 during the film forming process. Thus, it is possible to prevent deposits from adhering to the window 309. In addition, for example, the control device 100 controls the heater 308c and the heater 308d such that the window 309 has a temperature at which deposits are unlikely to adhere when cleaning the interior of the processing container 301. Thus, it is possible to efficiently remove the deposits that have adhered to the window 309. In the film forming process using amine and isocyanate, the temperature at which deposits are unlikely to adhere is, for example, a temperature of 300 degrees C. or higher.

The measurement device 200 includes a light emitter 201, a light receiver 202, and a measurer 203. The light emitter 201 outputs light having a plurality of wavelengths to the optical fiber 205 with an intensity indicated by the measurer 203. The light output to the optical fiber 205 is emitted into the processing container 301 via the window 309, and is reflected from a surface of the monitor part 310 in which the plurality of recesses 311 is formed. In the present embodiment, the light emitted into the processing container 301 via the window 309 is reflected from the plurality of recesses 311 in the monitor part 310 and the surface of the monitor part 310 around the plurality of recesses 311. The light reflected from the monitor part 310 is input to the measurement device 200 via the window 309 and the optical fiber 205.

The light receiver 202 receives the light input to the measurement device 200 via the optical fiber 205. In addition, the light receiver 202 outputs an electric signal corresponding to the intensity of the received light to the measurer 203 for each wavelength of the light. The measurer 203 measures a light reflectance for each wavelength in the monitor part 310 based on the intensity of the light emitted into the processing container 301 and the intensity of the light reflected from the monitor part 310. Then, the measurer 203 outputs data on a light reflectance distribution for each measured wavelength to the control device 100.

Figure 3:
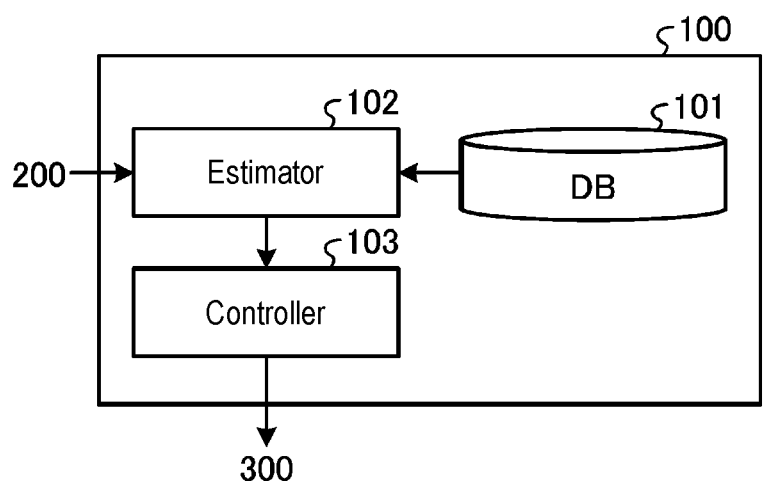
FIG. 3 is a block diagram illustrating an example of a functional configuration of a control device.

FIG. 3 is a block diagram illustrating an example of a functional configuration of the control device 100. The control device 100 includes a database (DB) 101, an estimator 102, and a controller 103. In the DB 101, waveform data 1010 shown in FIG. 4, for example, is stored in advance. In the waveform data 1010, data on a light reflectance distribution for each wavelength observed from light reflected from the monitor part 310 having a film of a certain thickness formed thereon is stored in advance in association with the thickness of the film formed on the surface of the monitor part 310 around the recesses 311. In addition, data, such as recipes and the like, necessary for a film forming process and cleaning of the interior of the processing container 301 are stored in the DB 101 in advance. The data necessary for the film forming process includes data on a thickness of the film formed on the substrate W.

The estimator 102 estimates the thickness of the film formed on the substrate W based on the light reflectance for each wavelength measured by the measurement device 200. For example, with reference to the waveform data 1010 stored in advance in the DB 101, the estimator 102 estimates the film thickness associated with the distribution having the highest similarity to the light reflectance distribution for each wavelength measured by the measurement device 200 as the thickness of the film formed on the substrate W.

Figure 5:
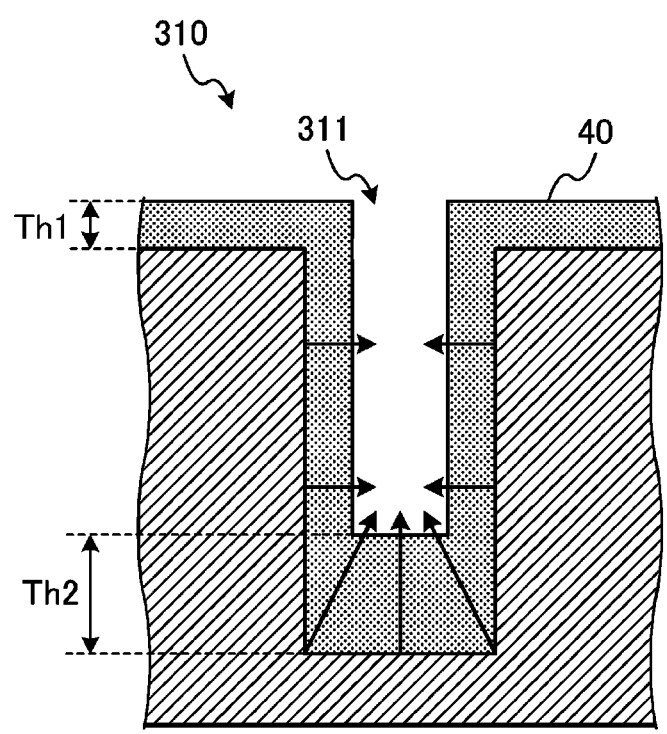
FIG. 5 is a cross-sectional view illustrating an example of a thickness distribution of a film formed on the monitor part.

Here, when the film forming process is performed in the processing container 301, the film is formed on a side wall and a bottom wall of each recess 311 of the monitor part 310. At this time, at a boundary between the side wall and the bottom wall of each recess 311, a film grows laterally and upward, for example, as illustrated in FIG. 5. As a result, a film thickness at the boundary between the side wall and the bottom wall of each recess 311 becomes thicker than the thickness of the film formed on an upper portion or the side wall of the recess 311. When the width of the recess 311 is narrow, for example, as illustrated in FIG. 5, a thickness Th2 of the film formed at the bottom of the recess 311 becomes thicker than a thickness Th1 of the film formed on the upper portion or the side wall of the recess 311.

In a method of measuring a film thickness by using interference of light, when the film thickness is small, the measurement accuracy of the film thickness becomes low. However, for example, by using the monitor part 310 having the structure as illustrated in FIG. 5, in a state in which a film 40 having the thickness Th1 is formed, it is possible to estimate the film thickness based on a light reflectance distribution for each wavelength from the film 40 having the thickness Th2 thicker than the thickness Th1.

Figure 6:
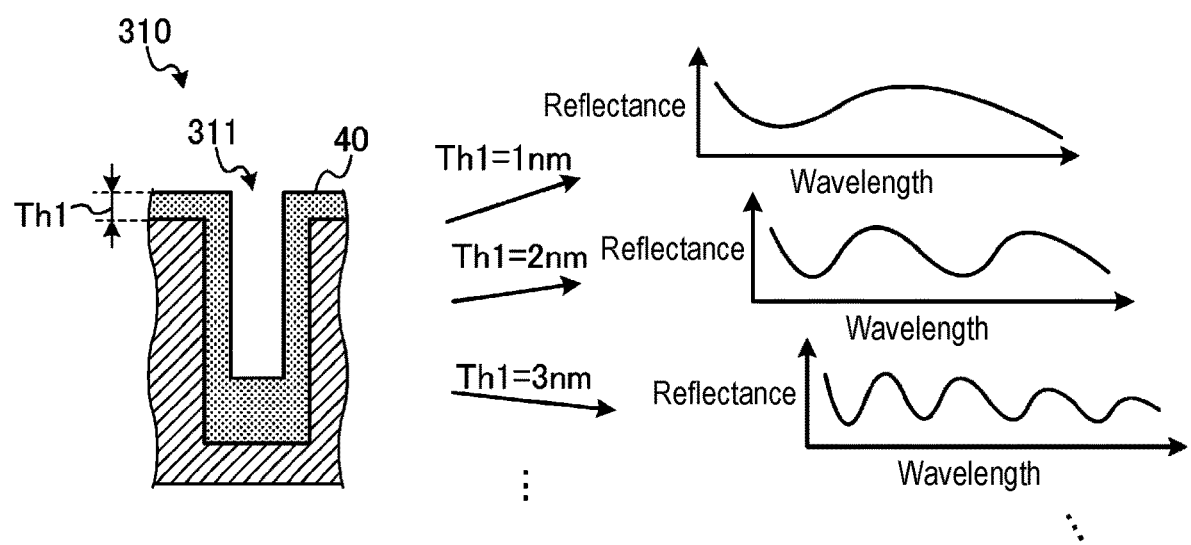
FIG. 6 is a view showing examples of a relationship between a film thickness and the waveform data.

For example, as illustrated in FIG. 6, a light reflectance distribution for each wavelength is measured in advance for each thickness Th1 of the film 40 formed around the recess 311. Then, after the light reflectance distribution for each wavelength is measured, the monitor part 310 is taken out, and the thickness Th1 of the film 40 formed on the upper portion of the recess 311 is measured by, for example, a scanning electron microscope. As a result, data on the light reflectance distribution for each wavelength is collected for each thickness Th1 of the film 40 formed on the upper portion of the recess 311, and is stored in advance in the DB 101 as the waveform data 1010. The thickness Th1 of the film 40 formed on the monitor part 310, which is placed on the stage 307 at a position adjacent to the substrate W, when the film forming process is performed on the substrate W may be regarded the thickness of the film 40 formed on the substrate W.

In the film forming process, with reference to the waveform data 1010 stored in advance in the DB 101, the estimator 102 specifies data on the light reflectance distribution for each wavelength, which is the closest distribution to the light reflectance distribution for each wavelength measured by the measurement device 200. Then, the estimator 102 estimates the film thickness associated with the specified data on the light reflectance distribution for each wavelength as the thickness of the film formed on the substrate W. Then, the estimator 102 outputs information indicating the estimated film thickness to the controller 103.

In addition, the estimator 102 may estimate the thickness of the film formed on the substrate W, based on similarity between the light reflectance distribution for each wavelength measured by the measurement device 200 and the light reflectance distribution for each wavelength stored in advance in the DB 101. For example, regarding the light reflectance distribution for each wavelength measured by the measurement device 200, a case where the similarity with the light reflectance distribution for each wavelength associated with the film thickness of 1 nm is 20 and the similarity with the light reflectance distribution for each wavelength associated with the film thickness of 2 nm is 80 is considered. The similarity assumed here indicates that a degree of similarity increases as a value increases. In this case, the estimator 102 estimates the thickness of the film formed on the substrate W to be, for example, 1 nm×20/(20+80)+2 nm×80/(20+80)=1.8 nm.

When executing the film forming process, the controller 103 controls respective components of the film forming apparatus 300 with reference to the data necessary for the film forming process stored in advance in the DB 101. In addition, when the film thickness estimated by the estimator 102 reaches a predetermined thickness, the controller 103 controls respective components of the film forming apparatus 300 to stop the film forming process on the substrate W. Thus, it is possible to form a film having a desired thickness on the substrate W.

[Film Forming Method]

Figure 7:
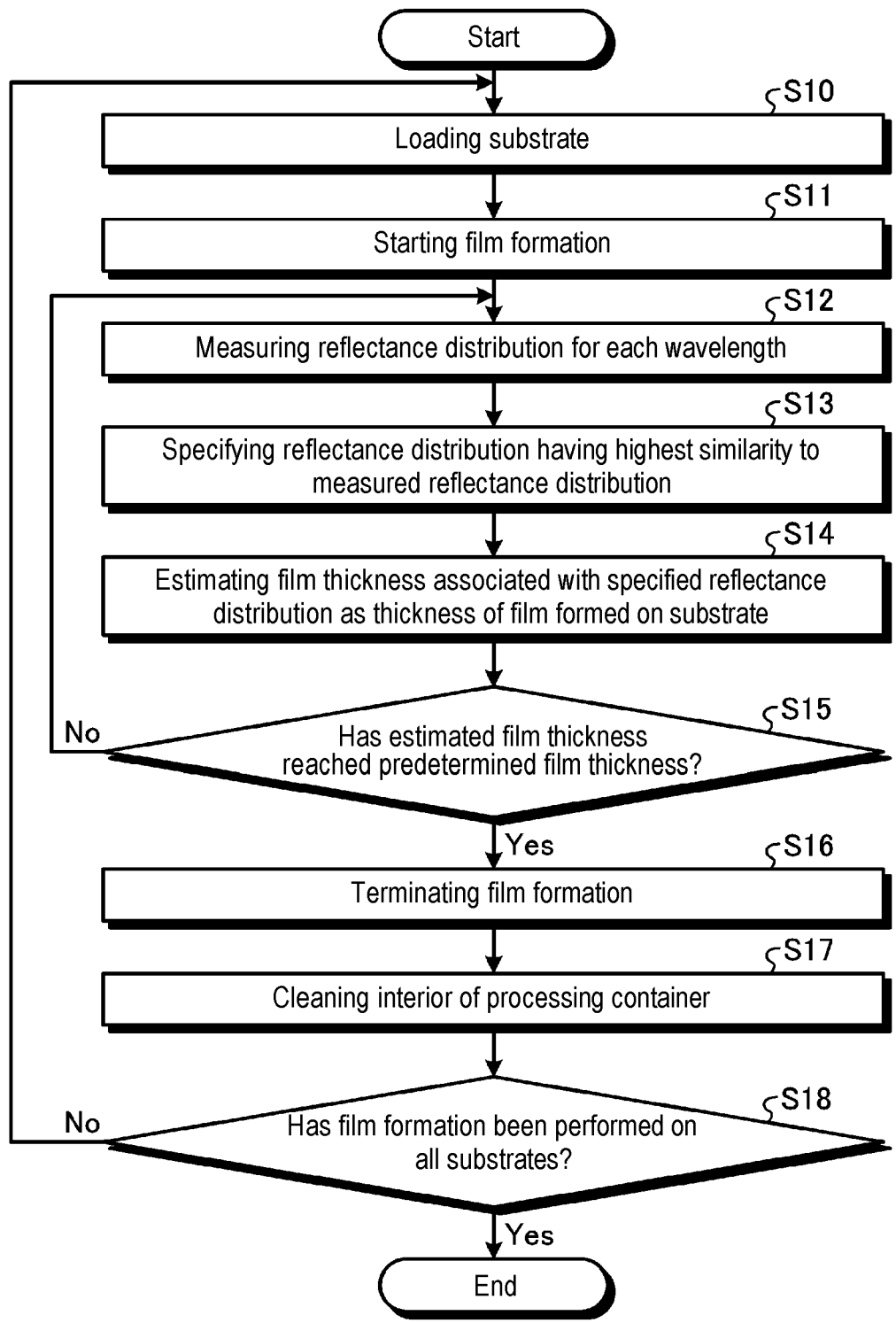
FIG. 7 is a flowchart illustrating an example of a film forming method.

FIG. 7 is a flowchart illustrating an example of a film forming method. The film forming method exemplified in FIG. 7 is implemented, for example, by controlling the measurement device 200 and the film forming apparatus 300 by the control device 100.

First, the substrate W is loaded into the processing container 301 of the film forming apparatus 300 by a transfer device (not illustrated) and placed on the stage 307 (step S10). Thereafter, a film forming process is started (step S11). Step S11 is an example of a) in the accompanying claims. In step S11, a temperature of the substrate W is controlled to be a temperature appropriate for the film forming process (e.g., 40 degrees C. to 200 degrees C.) by the heater 308a in the stage 307. In addition, a temperature of the monitor part 310 is also controlled to be the same as the temperature of the substrate W by the heater 308b in the stage 307. Furthermore, a temperature of the window 309 is controlled by the heater 308c and the heater 308d to be a temperature at which deposits are unlikely to adhere (e.g., 300 degrees C. or higher). Then, vapors of two types of monomers are supplied from the shower head 306 into the processing container 301, and a gas in the processing container 301 is exhausted by the exhaust device 302. As a result, a polymer film is formed on the substrate W by a vapor deposition polymerization reaction of the two types of monomers.

Subsequently, the measurement device 200 measures a light reflectance distribution for each wavelength by emitting light having a plurality of wavelengths to the monitor part 310 via the optical fiber 205 and the window 309 (step S12). Step S12 is an example of b) in the accompanying claims. In step S12, the light emitter 201 outputs light having the plurality of wavelengths to the optical fiber 205 with the intensity indicated by the measurer 203. The light output to the optical fiber 205 is emitted into the processing container 301 via the window 309 and reflected from the surface of the monitor part 310 in which the recesses 311 are formed. The light reflected from the monitor part 310 is received by the light receiver 202 via the window 309 and the optical fiber 205. The light receiver 202 outputs, for each wavelength of the light, an electric signal corresponding to the intensity of the received light to the measurer 203. The measurer 203 measures a light reflectance for each wavelength in the monitor part 310 based on the intensity of the light emitted to the processing container 301 and the intensity of the light reflected from the monitor part 310. Then, the measurer 203 outputs data on the measured light reflectance distribution for each wavelength to the control device 100.

Subsequently, with reference to the waveform data 1010, the estimator 102 of the control device 100 specifies the reflectance distribution having the highest similarity to the light reflectance distribution for each wavelength measured by the measurement device 200 (step S13). In addition, with reference to the waveform data 1010, the estimator 102 estimates the film thickness associated with the specified reflectance distribution as the thickness of the film formed on the substrate W (step S14). Steps S13 and S14 are examples of c) in the accompanying claims. Then, the estimator 102 outputs information indicating the estimated film thickness to the controller 103.

Subsequently, the controller 103 of the control device 100 determines whether or not the film thickness estimated by the estimator 102 has reached a predetermined thickness (step S15). When the film thickness estimated by the estimator 102 has not reached the predetermined thickness ("No" in step S15), the process illustrated in step S12 is executed again.

On the other hand, when the film thickness estimated by the estimator 102 has reached the predetermined thickness ("Yes" in step S15), the controller 103 controls respective components of the film forming apparatus 300 and terminates the film forming process (step S16). Step S16 is an example of d) in accompanying claims. Thereafter, the substrate W is unloaded from the processing container 301 by the transfer device (not illustrated).

Subsequently, the interior of the processing container 301 is cleaned (step S17). In step S17, the temperature of the monitor part 310 is controlled by the heater 308b to be higher than the temperature thereof during the film forming process (e.g., 300 degrees C. or higher). In addition, in step S17, the temperature of the window 309 is controlled by the heater 308c and the heater 308d to be a temperature at which deposits are unlikely to adhere (e.g., 300 degrees C. or higher). In addition, active species contained in plasma generated by a plasma generator (not illustrated) are supplied into the processing container 301, and the deposits adhered to the processing container 301 are removed by the active species supplied into the processing container 301.

Subsequently, the controller 103 determines whether or not the film forming process has been performed on all the substrates W to be processed (step S18). When the film forming process has not been performed on one or more of the substrates W to be processed ("No" in step S18), the process illustrated in step S10 is executed again. On the other hand, when the film forming process is performed on all the substrates W to be processed ("Yes" in step S18), the film forming method illustrated in this flowchart ends.

[Hardware]

Figure 8:
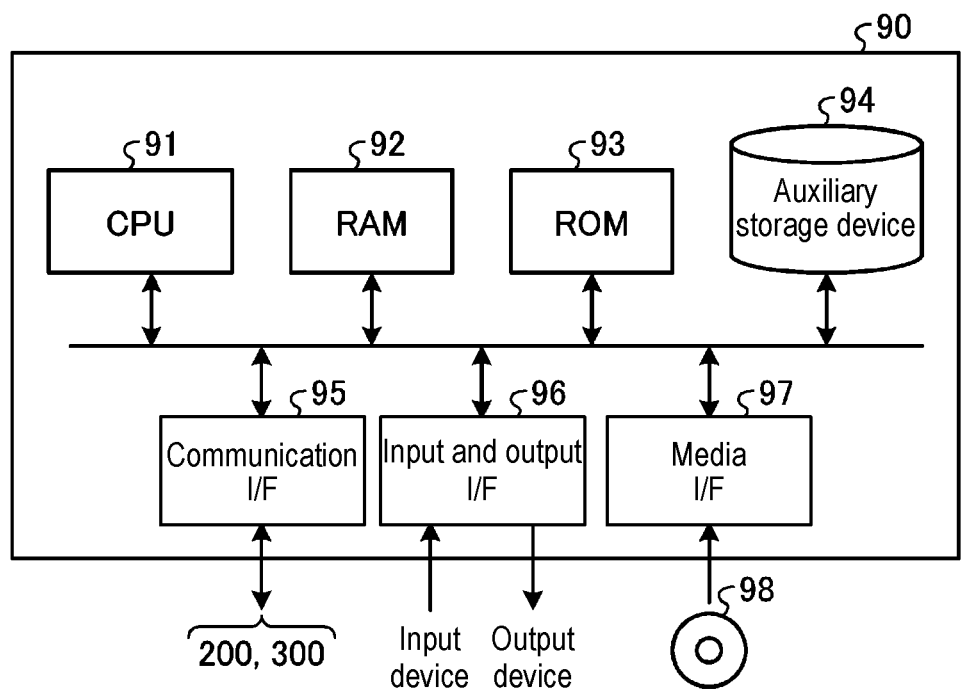
FIG. 8 is a hardware configuration diagram illustrating an example of a computer that implements the control device.

The control device 100 is implemented by, for example, a computer 90 having a configuration as illustrated in FIG. 8. FIG. 8 is a hardware configuration diagram illustrating an example of the computer 90 that implements the control device 100. The computer 90 includes a central processing unit (CPU) 91, and a random access memory (RAM) 92, a read only memory (ROM) 93, an auxiliary storage device 94, a communication interface (I/F) 95, an input and output I/F 96, and a media I/F 97.

The CPU 91 operates based on a program stored in the ROM 93 or the auxiliary storage device 94 that are computer readable storage medium, and controls respective components. The ROM 93 stores, for example, a boot program executed by the CPU 91 when the computer 90 starts up, a program dependent on the hardware of the computer 90, and the like.

The auxiliary storage device 94 is, for example, a hard disk drive (HDD) or a solid state drive (SSD) that are computer readable storage devices, and stores, for example, a program executed by the CPU 91 and data used by the program. The CPU 91 reads the program from the auxiliary storage device 94, loads the program on the RAM 92, and executes the loaded program.

The communication I/F 95 communicates with the measurement device 200 and the film forming apparatus 300 via a communication line such as a local area network (LAN). The communication I/F 95 receives data from the measurement device 200 or the film forming apparatus 300 via the communication line and sends the data to the CPU 91, and transmits data generated by the CPU 91 to the measurement device 200 or the film forming apparatus 300 via the communication line.

The CPU 91 controls an input device such as a touch panel and an output device such as a display via the input and output I/F 96. The CPU 91 acquires a signal input from the input device via the input and output I/F 96 and sends the input signal to the CPU 91. In addition, the CPU 91 outputs generated data to the output device via the input and output I/F 96.

The media I/F 97 reads a program or data stored in a recording medium 98, and stores the program or data in the auxiliary storage device 94. The recording medium 98, which is a computer readable storage medium, may be, for example, an optical recording medium such as a digital versatile disk (DVD) and a phase change rewritable disk (PD), a magneto-optical recording medium such as magneto-optical (MO) disk, a tape medium, a magnetic recording medium, a semiconductor memory, or the like.

The CPU 91 of the computer 90 implements respective functions of the estimator 102 and the controller 103 by executing the program loaded on the RAM 92. The waveform data 1010 is stored in advance in the ROM 93 or the auxiliary storage device 94.

The CPU 91 reads the program loaded on the RAM 92 from the recording medium 98 and stores the program in the auxiliary storage device 94. As another example, the CPU 61 may acquire a program from another device via a communication line and store the program in the auxiliary storage device 94. Alternatively, the CPU 91 may acquire a program from another device via a communication line, load the acquired program on the RAM 92, and execute the program.

Embodiments have been described above. As described above, the film forming system 10 of the present embodiment includes the film forming apparatus 300 configured to form a film on the substrate W, the measurement device 200 configured to measure a light reflectance for each wavelength in the film formed at a predetermined position in the film forming apparatus 300, and the control device 100 configured to control the measurement device 200 and the film forming apparatus 300. The film forming apparatus 300 includes the processing container 301, the stage 307, the window 309, and the monitor part 310. The stage 307 is provided in the processing container 301, and the substrate W is placed thereon. The monitor part 310 is provided in the processing container 301 and has the recesses 311. The window 309 is provided on the wall surface of the processing container 301 and is formed by a light-transmitting member. The measurement device 200 includes the light emitter 201, the light receiver 202, and the measurer 203. The light emitter 201 emits light having a plurality of wavelengths to the monitor part 310 via the window 309. The light receiver 202 receives, via the window 309, light reflected from the monitor part 310 for each wavelength. The measurer 203 measures a light reflectance for each wavelength in the monitor port 310 based on the intensity of the light emitted to the processing container 301 and the intensity of the light reflected from the monitor part 310. The control device 100 includes an estimator 102 and a controller 103. The estimator 102 estimates the thickness of the film formed on the substrate W based on the light reflectance for each wavelength in the monitor part 310. The controller 103 stops the film forming process on the substrate W when the estimated film thickness reaches a predetermined thickness. Thus, it is possible to control the thickness of the film formed on the substrate W with high accuracy.

In the above-described embodiments, the control device 100 includes the DB 101 configured to store the waveform data 1010 that represents a light reflectance distribution for each wavelength in association with a thickness of a film formed around the recesses 311 in the monitor part 310. With reference to the DB 101, the estimator 102 estimates the film thickness associated with a distribution having the highest similarity to the light reflectance distribution for each wavelength measured by the measurement device 200 as the thickness of the film formed on the substrate W. Thus, it is possible to control the thickness of the film formed on the substrate W with high accuracy.

In the above-described embodiments, the depth D1 of each recess 311 is 20 nm or more, and the opening width W1 of each recess 311 has a width of twice or less the thickness of the polymer film formed on the substrate W. Thus, it is possible to increase the thickness of the film formed at the bottom of the recesses 311.

In addition, in the above-described embodiments, the monitor part 310 is disposed on the top surface of the stage 307 and in a region outside the region of the stage 307 on which the substrate W is placed. Thus, it is possible to maintain a high correlation between the thickness of the film formed on the monitor part 310 and the thickness of the film formed on the substrate W. Therefore, it is possible to control the thickness of the film formed on the substrate W with high accuracy.

In the above-described embodiments, the film forming apparatus 300 further includes the shower head 306 configured to form a polymer film on the substrate W placed on the stage 307 by supplying two types of monomer gases into the processing container 301. The polymer film is also formed on the monitor part 310. The two types of monomer gases are amine gas and isocyanate gas, and the polymer has urea bonds. Since a film forming rate of a polymer having urea bonds changes with slight changes in conditions such as pressure and temperature, it is difficult to control a thickness of such a polymer film. In connection with this, in the present embodiment, the thickness of the polymer film formed on the substrate W can be measured in real time based on the light reflectance for each wavelength in the monitor part 310 having the recesses 311. Thus, it is possible to control the thickness of the film formed on the substrate W with high accuracy.

In the above-described embodiments, a heater configured to heat the window 309 is provided around the window 309, and the window 309 is heated to 300 degrees C. or higher when the polymer film is formed on the substrate W. Thus, it is possible to prevent deposits from adhering to the window 309, and to measure the light reflectance for each wavelength in the monitor part 310 with high accuracy even during the film forming process. Therefore, it is possible to control the thickness of the film formed on the substrate W with high accuracy.

In the above-described embodiments, a heater configured to heat the window 309 is provided around the window 309, and the window 309 is heated to 300 degrees C. or higher when the interior of the processing container 301 is cleaned. Thus, it is possible to efficiently remove the deposits adhered to the window 309. Therefore, it is possible to control the thickness of the film formed on the substrate W with high accuracy.

In the above-described embodiments, the monitor part 310 is disposed on the top surface of the stage 307 and in a region of the stage 307 outside a region where the substrate W is placed, and a heater configured to heat the monitor part 310 is provided inside the stage 307 below the monitor part 310. The monitor part 310 is heated to 300 degrees C. or higher when the interior of the processing container 301 is cleaned. Thus, it is possible to efficiently remove the deposits adhered to the monitor part 310. Therefore, it is possible to control the thickness of the film formed on the substrate W with high accuracy.

The film forming method in the above-described embodiments includes a), b), c), and d) in the accompanying claims. In a), a film is formed on the substrate W placed on the stage 307 in the processing container 301. In b), light having a plurality of wavelengths is emitted to the monitor part 310, which is provided in the processing container 301 and has the recesses 311, via the window 309, which is provided on the wall surface of the processing container 301 and formed by a light-transmitting member, and a light reflectance for each wavelength in the monitor part 310 is measured based on the intensity of the light emitted to the monitor part 310 and the intensity of the light reflected from the monitor part 310. In c), a thickness of the film formed on the substrate W is estimated based on the light reflectance for each wavelength in the monitor part 310. In d), when the estimated film thickness has reached a predetermined thickness, the film forming process on the substrate W is stopped. Thus, it is possible to control the thickness of the film formed on the substrate W with high accuracy.

[Others]

The technology disclosed herein is not limited to the embodiments described above, and various modifications can be made within the scope of the gist the present disclosure.

For example, in the above-described embodiments, light having a plurality of wavelengths is emitted to the monitor part 310, which has the recesses 311 and is provided on the stage 307, and the thickness of the film formed on the substrate W is estimated based on the light reflectance distribution for each wavelength in the monitor part 310. However, the technique disclosed herein is not limited thereto. As long as the recesses 311 are formed in the processing container 301, the recesses 311 may be formed on the top surface of the stage 307 and outside a region where the substrate W is placed, or may be formed in the wall surface of the processing container 301. However, even in those cases, the window 309 is provided at a position facing the surface on which the recesses 311 are formed, and light having a plurality of wavelengths is emitted to the surface on which the recesses 311 are formed via the window 309.

In addition, in the above-described embodiments, light having a plurality of wavelengths is emitted to the surface in which the plurality of recesses 311 is formed, but the disclosed technique is not limited thereto. As another form, spot light having a plurality of wavelengths may be emitted to bottoms of the recesses 311. With such a configuration, it is possible to suppress the influence of the film, which is formed in the vicinities of the recesses 311 and on the side walls of the recesses 311, on the measurement of the light reflectance distribution for each wavelength. Thus, it is possible to suppress noise in the measurement of the light reflectance distribution for each wavelength.

In addition, in the above-described embodiments, a polymer having urea bonds is used as an example of the polymer, but a polymer having bonds other than the urea bonds may be used. An example of the polymer having bonds other than the urea bonds includes polyurethane having urethane bonds. Polyurethane may be synthesized, for example, by copolymerizing a monomer having an alcohol group and a monomer having an isocyanate group. In addition, polyurethane is depolymerized into a monomer having an alcohol group and a monomer having an isocyanate group by being heated to a predetermined temperature.

According to various aspects and embodiments of the present disclosure, it is possible to control a thickness of a film formed on a substrate with high accuracy.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming system comprising:
a film forming apparatus configured to form a film on a substrate;
a measurement device configured to measure a light reflectance for each wavelength in a film formed at a predetermined position in the film forming apparatus; and
a control device configured to control the film forming apparatus and the measurement device,
wherein the film forming apparatus comprises:
a processing container;
a stage provided in the processing container and configured to place the substrate on the stage;
a structure having recesses and provided at the predetermined position, which is located outside a region where the substrate is placed on the stage, in the processing container;
a window provided above the predetermined position where the structure is provided and in a wall surface, which is at a position facing the structure, of the processing container and formed by a light-transmitting member;
a first heater configured to control a temperature of the substrate; and
a second heater provided separately from the first heater and configured to control a temperature of the structure,
wherein the measurement device comprises:
a light emitter configured to emit light having a plurality of wavelengths to the structure via the window;
a light receiver configured to receive light for each wavelength reflected from the structure via the window; and
a measurer configured to measure a light reflectance for each wavelength of a film formed at a bottom portion of the recesses of the structure based on an intensity of the light emitted to the film formed at the bottom portion of the recesses and an intensity of the light reflected from the film formed at the bottom portion of the recesses,
wherein the control device comprises:
an estimator configured to estimate a thickness of the film formed on the substrate based on the light reflectance for each wavelength of the film formed at the bottom portion of the recesses; and
a controller configured to stop film formation on the substrate when the estimated thickness of the film reaches a predetermined thickness,
wherein a thickness of the film formed at the bottom portion of the recesses is thicker than the thickness of the film formed on the substrate, and
wherein the control device is further configured to:
control the second heater such that the structure and the substrate have a same temperature during a film forming process; and
when cleaning an interior of the processing container, control the second heater such that the structure has a temperature higher than the temperature of the structure during the film forming process.

2. The film forming system of claim 1, wherein the control device further comprises a database configured to store data indicating a reflectance distribution of light for each wavelength in association with a thickness of a film formed around the recesses, and
  wherein the estimator is further configured to estimate, with reference to the database, a film thickness, which is associated with a reflectance distribution having the highest similarity to the reflectance distribution of light for each wavelength measured by the measurer, as the thickness of the film formed on the substrate.

3. The film forming system of claim 2, wherein a depth of the recesses is 20 nm or more, and
  wherein an opening width of the recesses is equal to or less than twice the thickness of the film formed on the substrate.

4. The film forming system of claim 3, wherein the structure is disposed on a top surface of the stage and in a region of the stage outside the region where the substrate is placed on the stage.

5. The film forming system of claim 4, wherein the film forming apparatus further comprises a gas supply configured to form a polymer film on the substrate placed on the stage by supplying two types of monomer gases into the processing container, and
  wherein the polymer film is formed on the structure.

6. The film forming system of claim 5, wherein the two types of monomer gases are amine gas and isocyanate gas, and a polymer of the polymer film has urea bonds.

7. The film forming system of claim 6, wherein a third heater configured to heat the window is provided in a vicinity of the window, and
  wherein when the polymer film is formed on the substrate, the window is heated to 300 degrees C. or higher.

8. The film forming system of claim 7, wherein when the interior of the processing container is cleaned, the window is heated to 300 degrees C. or higher.

9. The film forming system of claim 8, wherein the second heater is configured to heat the structure and is provided in the stage below the structure, and
  wherein when the interior of the processing container is cleaned, the structure is heated to 300 degrees C. or higher.

10. The film forming system of claim 5, wherein a third heater configured to heat the window is provided in a vicinity of the window, and
  wherein when the polymer film is formed on the substrate, the window is heated to 300 degrees C. or higher.

11. The film forming system of claim 5, wherein a third heater configured to heat the window is provided in a vicinity of the window, and
  wherein when the interior of the processing container is cleaned, the window is heated to 300 degrees C. or higher.

12. The film forming system of claim 5, wherein the second heater is configured to heat the structure is provided in the stage below the structure, and
  wherein when the interior of the processing container is cleaned, the structure is heated to 300 degrees C. or higher.

13. The film forming system of claim 1, wherein a depth of the recesses is 20 nm or more, and
  wherein an opening width of the recesses is equal to or less than twice the thickness of the film formed on the substrate.

14. The film forming system of claim 1, wherein the structure is disposed on a top surface of the stage and in a region of the stage outside the region where the substrate is placed on the stage.

15. The film forming system of claim 1, wherein the film forming apparatus further comprises a gas supply configured to form a polymer film on the substrate placed on the stage by supplying two types of monomer gases into the processing container, and
  wherein the polymer film is formed on the structure.

* * * * *